(12) United States Patent
Shih et al.

(10) Patent No.: US 11,388,829 B2
(45) Date of Patent: Jul. 12, 2022

(54) CHASSIS MOUNTING FRAME AND CHASSIS

(71) Applicant: Fulian Precision Electronics (Tianjin) Co., LTD., Tianjin (CN)

(72) Inventors: Tung-Ho Shih, New Taipei (TW); Yao-Chih Liu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/018,436

(22) Filed: Sep. 11, 2020

(65) Prior Publication Data
US 2021/0410313 A1    Dec. 30, 2021

(30) Foreign Application Priority Data
Jun. 24, 2020   (CN) .......................... 202010592600.7

(51) Int. Cl.
*H05K 7/14*    (2006.01)
(52) U.S. Cl.
CPC ......... *H05K 7/1402* (2013.01); *H05K 7/1488* (2013.01)
(58) Field of Classification Search
None
See application file for complete search history.

(56) References Cited

U.S. PATENT DOCUMENTS

| | | | | |
|---|---|---|---|---|
| 4,991,818 A * | 2/1991 | Darbo | ................. | H05K 7/1411 248/681 |
| 5,721,669 A * | 2/1998 | Becker | ................. | G11B 33/124 361/679.31 |
| 6,147,872 A * | 11/2000 | Roy | ..................... | H05K 7/1409 211/41.17 |
| 6,171,120 B1 * | 1/2001 | Bolich | ............ | H01R 13/62933 361/679.4 |
| 6,354,164 B1 * | 3/2002 | Megason | ................ | F16H 51/00 439/157 |
| 6,406,312 B1 * | 6/2002 | Heitkamp | ............ | H05K 7/1409 361/754 |
| 6,549,424 B1 * | 4/2003 | Beseth | ................. | H05K 7/1409 361/726 |
| 8,936,477 B1 * | 1/2015 | Kerrigan | ................ | H01R 43/26 439/157 |
| 2020/0396858 A1 * | 12/2020 | Wu | ....................... | H05K 7/1411 |
| 2021/0045261 A1 * | 2/2021 | Huang | ................... | H05K 7/1489 |
| 2021/0385962 A1 * | 12/2021 | Chang | ................... | H05K 5/023 |

FOREIGN PATENT DOCUMENTS

| | | |
|---|---|---|
| TW | I369935 B1 | 8/2012 |
| TW | M483460 U | 8/2014 |

* cited by examiner

*Primary Examiner* — Rockshana D Chowdhury
*Assistant Examiner* — Christopher L Augustin
(74) *Attorney, Agent, or Firm* — ScienBiziP, P.C.

(57) ABSTRACT

A chassis mounting frame includes a frame body, a fixing plate, a coupling member, a rotating member, and a pivoting member. The fixing plate is mounted on a side of the frame body and includes a resisting structure. The rotating member is provided on the frame body and coupled to the coupling member and configured to drive the coupling member to move inside the frame body and drive the coupling member and the frame body to move together. The pivoting member is provided on a side of the frame body and coupled to the coupling member. The coupling member is configured to drive the pivoting member to rotate to resist against the resisting structure.

12 Claims, 10 Drawing Sheets

CHASSIS MOUNTING FRAME AND CHASSIS

FIELD

The subject matter herein generally relates to a chassis, and more particularly to a chassis mounting frame.

BACKGROUND

A large chassis may include a drawer-like fixing frame for fixing some mechanisms, such as expansion cards and connectors. Generally, a connector provided on the fixing frame is moved by rotation of a handle to connect with another connector. However, the handle is generally provided only on one side of the fixing frame, so that when the fixing frame is tilted, a gap between the two connectors after connection may exist, resulting in an unstable connection.

BRIEF DESCRIPTION OF THE DRAWINGS

Implementations of the present disclosure will now be described, by way of embodiments, with reference to the attached figures.

DETAILED DESCRIPTION

Figure 1:
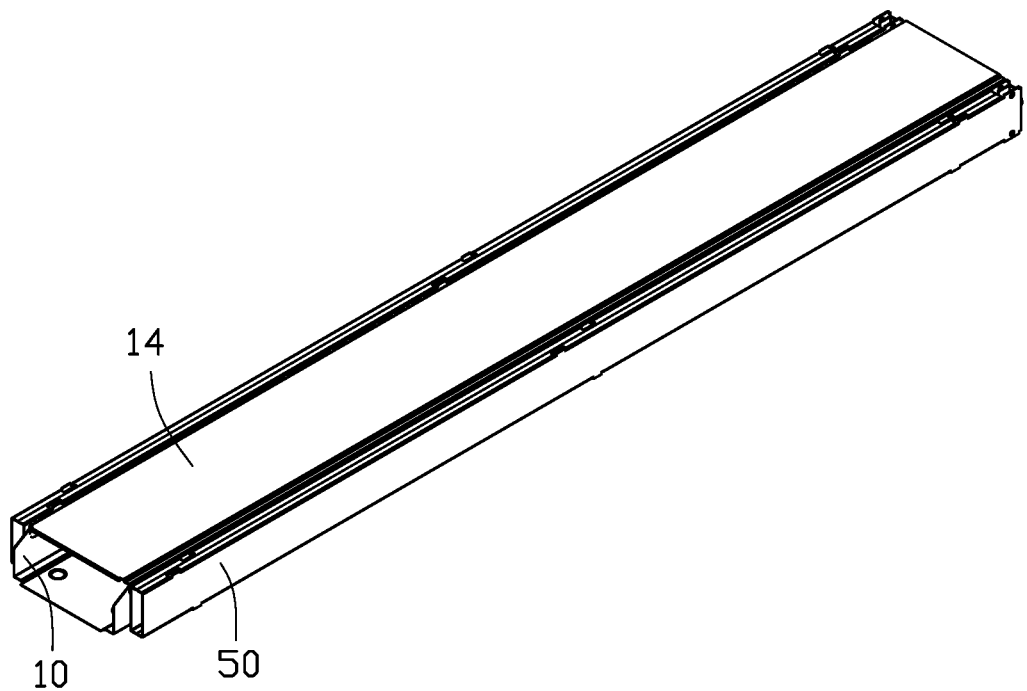
FIG. 1 is a perspective schematic view of a chassis mounting frame according to an embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
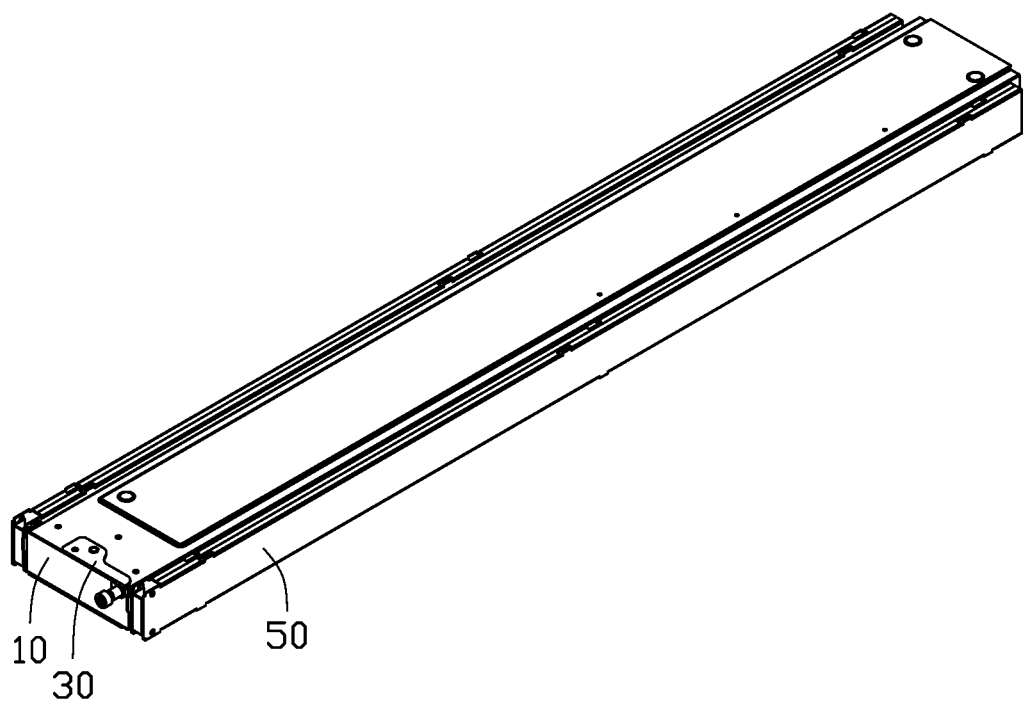
FIG. 2 is a perspective schematic view of the chassis mounting frame shown in FIG. 1 from another perspective.

Referring to FIGS. 1 and 2, a chassis mounting frame 1 includes a frame body 10, fixing plates 50, a coupling member 20, a rotating member 30, and pivoting members 40. The fixing plates 50 are located on sides of the frame body 10, and the fixing plates 50 are provided with resisting structures 51. The coupling member 20 is located on the frame body 10. The rotating member 30 is located on the frame body 10 and connected to the coupling member 20. The rotating member 30 drives the connecting member 20 to move in the frame body 10 and drives the frame body 10 and the coupling member 20 to move together. The pivoting members 40 are located on side walls of the frame body 10 and connected to the coupling member 20. The coupling member 20 drives the pivoting members 40 to move so that the pivoting members 40 resist against the resisting structures 51.

Figure 3:
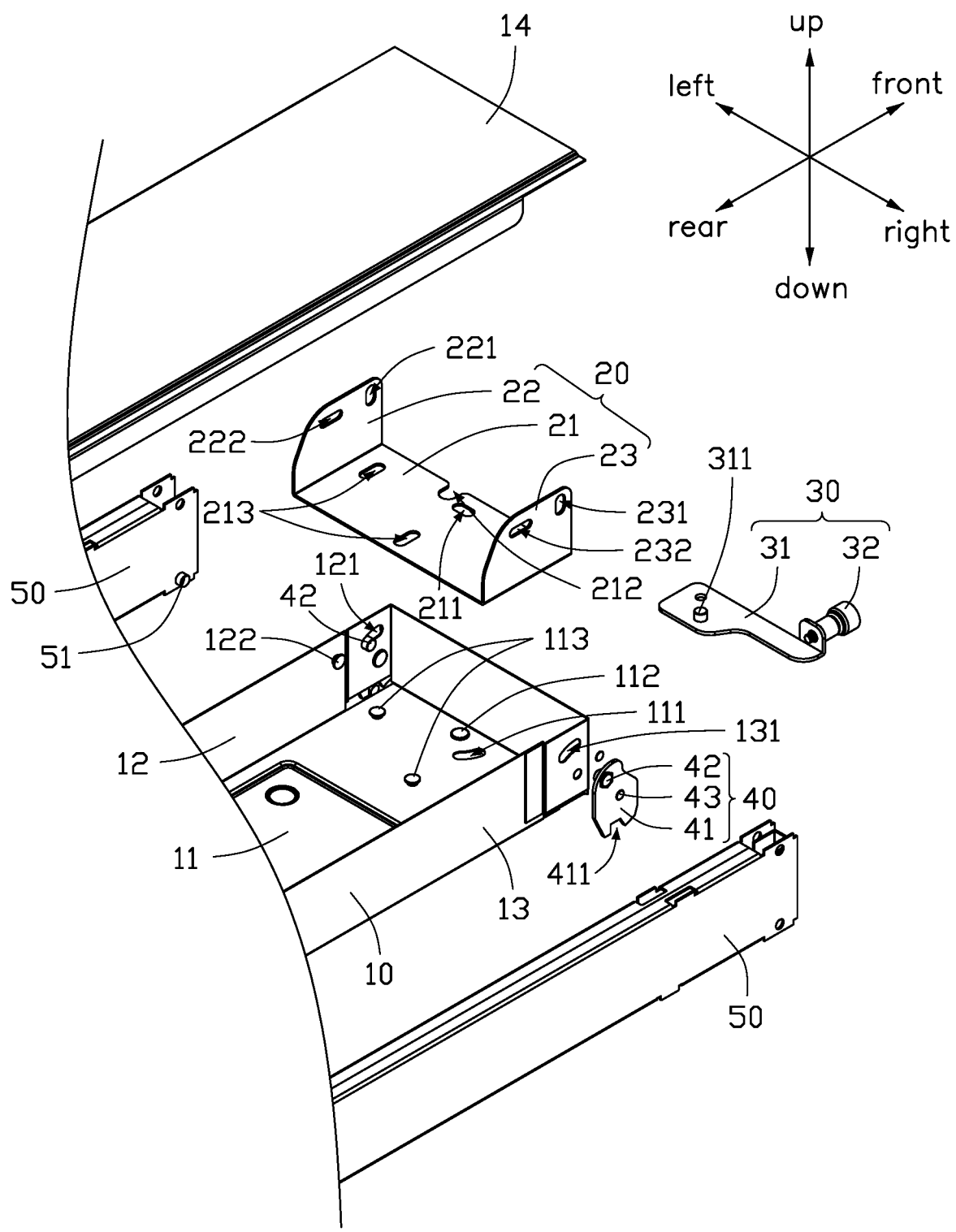
FIG. 3 is a partial exploded, schematic diagram of the chassis mounting frame shown in FIG. 1.

Referring to FIG. 3, the frame body 10 is a hollow rectangular parallelepiped structure. The frame body 10 includes a first bottom plate 11, a first side plate 12, a second side plate 13, and a cover plate 14. The first side plate 12 and the second side plate 13 are provided at opposite sides of the first bottom plate 11 and are perpendicular to the first bottom plate 11. The cover plate 14 is provided on the first side plate 12 and the second side plate 13 and is parallel to the first bottom plate 11.

The first bottom plate 11 defines a first through hole 111 adjacent to a front end of the first bottom plate 11. The first through hole 111 is an arc-shaped hole having a predetermined length. The first bottom plate 11 is further provided with a first limiting post 112 and second limiting posts 113. The first limiting post 112 is located near the edge of the front end of the first bottom plate 11, and the second limiting posts 113 are located on a side of the first limiting post 112.

In one embodiment, the first bottom plate 11 includes three second limiting posts 113, and the three second limiting posts 113 are provided on a circumferential side of the first limiting post 112.

It can be understood that, in other embodiments, the shape of the first through hole 111 is not limited thereto. The number of the second limiting posts 113 is not limited thereto, and the positions of the second limiting posts 113 can also be changed.

Referring to FIG. 3, the first side plate 12 defines a third through hole 121, and the second side plate 13 defines a third through hole 131 at a position corresponding to the third through hole 121 of the first side plate 12. The third through holes 121, 131 are arc-shaped holes having a predetermined length.

It can be understood that, in other embodiments, the shapes and positions of the third through holes 121, 131 are not limited thereto.

In one embodiment, the first side plate 12 is provided with a second limiting post 122, and the second side plate 13 is provided with a second limiting post 132 at a position corresponding to the second limiting post 132. The second limiting posts 122, 132 guide the coupling member 20 so that the coupling member 20 can move smoothly.

It can be understood that, in other embodiments, the second limiting post 122 on the first side plate 12 and the second limiting post 132 on the second side plate 13 do not correspond in position.

The frame body 10 further includes two sealing plates (not shown in the figures). The sealing plates are perpendicularly arranged on the first bottom plate 11 and connected to the first side plate 12 and the second side plate 13 to form a hollow cuboid structure.

The coupling member 20 is substantially U-shaped in cross-section and disposed inside the frame body 10. The coupling member 20 includes a second bottom plate 21, a third side plate 22, and a fourth side plate 23. The second bottom plate 21 is attached to the first bottom plate 11. The third side plate 22 and the fourth side plate 23 are respectively provided on opposite sides of the second bottom plate 21 and are perpendicular to the second bottom plate 21. Further, the third side plate 22 is attached to the first side plate 12, and the fourth side plate 23 is attached to the second side plate 13.

The second bottom plate 21 defines a second through hole 211 at a position corresponding to the first through hole 111. The second through hole 211 is an oblong hole extending in a first direction (left and right) of the second bottom plate 21. The second bottom plate 21 defines a first groove 212 at a front edge of the second bottom plate 21, and the first groove 212 corresponds to the first limiting post 112. The second bottom plate 21 defines limiting holes 213. When the coupling member 20 moves toward the first limiting post 112 in the frame body 10, the second limiting posts 113 are locked in the limiting holes 213 to stop the coupling member 20. The limiting holes 213 are oblong holes extending in a second direction (front and rear) perpendicular to the second through hole 211. The second limiting posts 113 located in the limiting holes 213 enable the coupling member 20 to move smoothly.

In one embodiment, the number of the limiting holes 213 on the second bottom plate 21 is the same as the number of the second limiting posts 113 on the first bottom plate 11. It can be understood that, in other embodiments, the number of the limiting holes 213 on the second bottom plate 21 may vary with the number of the second limiting posts 113 on the first bottom plate 11.

In another embodiment, the second limiting posts 113 are provided on the second bottom plate 21, and the limiting holes 213 are defined in the first bottom plate 11.

The third side plate 22 defines a fourth through hole 221 at a position corresponding to the third through hole 121. The fourth through hole 221 is an oblong hole extending in a third direction (up and down) perpendicular to the first direction and the second direction. The third side plate 22 further defines a limiting hole 222. The limiting hole 222 is an oblong hole extending in the second direction perpendicular to the fourth through hole 221. The second limiting post 122 is received in the limiting hole 222 for limiting the coupling member 20.

The fourth side plate 23 defines a fourth through hole 231 at a position corresponding to the third through hole 131. The fourth through hole 231 is an oblong hole extending in the third direction. The fourth side plate 23 further defines a limiting hole 232. The limiting hole 232 is an oblong hole extending in the second direction perpendicular to the fourth through hole 231. The second limiting post 132 is received in the limiting hole 232 for limiting the coupling member 20.

It can be understood that, if the second limiting posts 113 on the first bottom plate 11 and the limiting holes 213 on the second bottom plate 21 are sufficient for the coupling member 20 to move smoothly, the limiting holes 222, 232 can be omitted, and the corresponding second limiting posts 122, 132 can be correspondingly omitted.

The rotating member 30 is disposed on a side of the first bottom plate 11 facing away from the second bottom plate 21, and the first limiting post 112 fixes the rotating member 30 to the first bottom plate 11. Further, the rotating member 30 can rotate relative to the frame body 10, and the first limiting post 112 is used as a center of rotation. In one embodiment, the rotating member 30 includes a rotating portion 31 and an operating portion 32. The operating portion 32 is provided on the rotating portion 31. The rotating portion 31 is connected to the first bottom plate 11. By operating the operating portion 32, the rotating portion 31 can rotate relative to the frame body 10.

The rotating portion 31 is provided with a first protrusion 311 received in the first through hole 111 and the second through hole 211. When the operating portion 32 is operated, the operating portion 32 drives the rotating portion 31 to rotate, and the rotating portion 31 drives the first protrusion 311 to move in the first through hole 111 and the second through hole 211. The first protrusion 311 is configured to move in two perpendicular movement directions. A first movement direction is a direction of the coupling member 20 moving in the frame body 10, and a second movement direction is from one end of the second through hole 211 to the other end of the second through hole 211.

In one embodiment, the rotating portion 31 is a connecting piece, and the operating portion 32 is a handle. It can be understood that, in other embodiments, the rotating portion 31 may be replaced with a rotating rod or a connecting plate, and the operating portion 32 may be replaced with a structure capable of driving the rotating portion 31 to rotate.

After the rotating member 30 drives the coupling member 20 to move a predetermined distance in the frame body 10, the second limiting posts 113, 122, and 132 bear against the coupling member 20. When the rotating member 30 continues to rotate, the rotating member 30 drives the frame body 10 and the coupling member 20 to move together.

The chassis mounting frame 1 includes two pivoting members 40 respectively disposed on an outer side at end positions of the first side plate 12 and the second side plate 13. The pivoting member 40 includes a pivoting portion 41 and a second protrusion 42. The second protrusion 42 is disposed on the pivoting portion 41, and the two second protrusions 42 are received in the third through holes 121, 131 and the fourth through holes 221, 231. When the coupling member 20 moves in the frame body 10, the second protrusion 42 move in the third through holes 121, 131 and the fourth through holes 221, 231, thereby driving the pivoting portion 41 to rotate.

In one embodiment, each pivoting member 40 further includes a pivoting pin 43, and the pivoting portions 41 are fixed to the first side plate 12 and the second side plate 13 by the pivoting pins 43. During rotation, the pivoting portion 41 rotates about the pivoting pin 43.

The pivoting portion 41 defines a second notch 411 in an end position of the pivoting portion 41. The second notch 411 is substantially U-shaped. When the pivoting portion 41 rotates, an inner wall of the second notch 411 resists the resisting structure 51. When the frame body 10 is pulled, the pivoting portion 41 can detach from the resisting structure 51.

The chassis mounting frame 1 includes two fixing plates 50 respectively provided on the first side plate 12 and the second side plate 13 of the frame body 10. In one embodiment, the length of the fixing plate 50 is substantially the same as the length of the frame body 10.

The resisting structure 51 is provided on each of the fixing plates 50, and the position of the resisting structure 51 corresponds to the position of the second notch 411, so that the two second notches 411 respectively resist the resisting structure 51. In one embodiment, the resisting structure 51 is a columnar post. It can be understood that, in other embodiments, the resisting structure 51 may be replaced with a buckle, a hook, or other structures that can perform equivalent functions.

Referring to FIG. 3, before the rotating member 30 rotates, the first limiting post 112 has not been fixed in the first groove 212 of the coupling member 20, the first protrusion 311 is located at a first end of the second through hole 211, the second limiting posts 113, 122, 132 are located at front ends of the limiting holes 213, 222, 232, and a rear end of the inner wall of the second notch 411 resists against the resisting structure 51.

Figure 4:
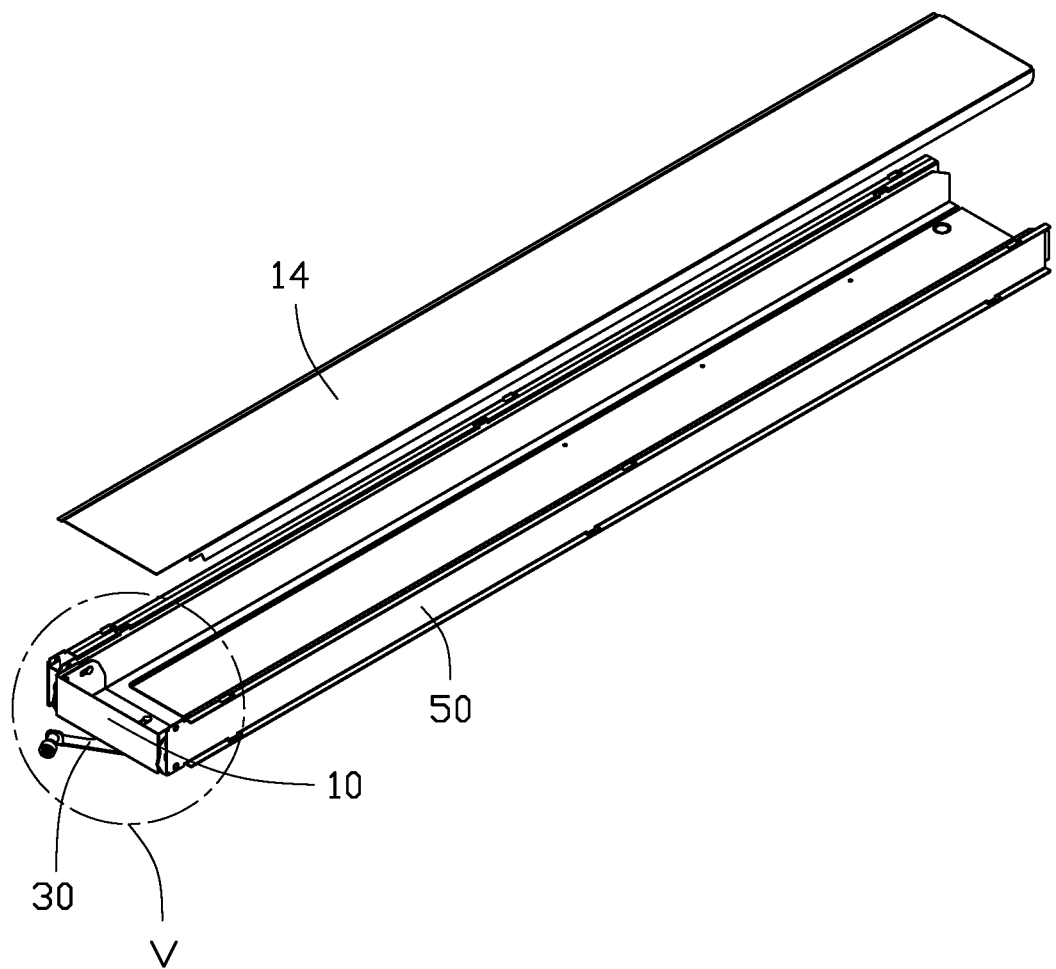
FIG. 4 is a schematic perspective view of a rotating member after rotation.
Figure 5:
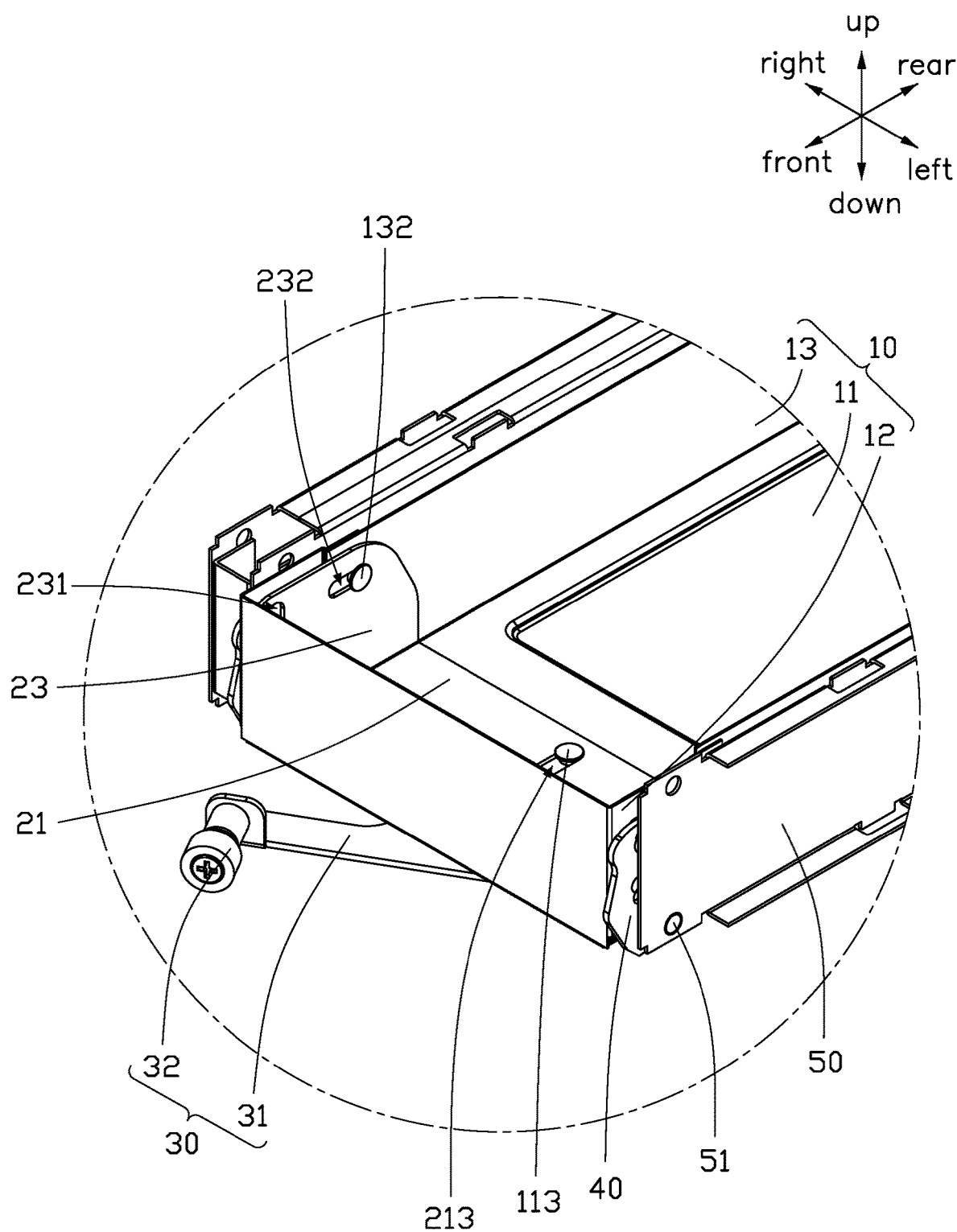
FIG. 5 is an enlarged view of circled portion V in FIG. 4.

Referring to FIG. 4, when the operation portion 32 is operated, the rotating member 30 rotates counterclockwise. After the rotating member 30 rotates by a predetermined angle, the rotating member 30 drives the coupling member 20 to move in the frame body 10 toward a front end of the frame body 10. At this time, the first limiting post 112 is not yet fixed in the first groove 212, the first protrusion 311 moves from the first end of the second through hole 211 to a second end of the second through hole 211, the second protrusions 42 move from a lower end to an upper end of the fourth through holes 221, 231, the second limiting posts 113, 122, 132 move from a front end to a rear end of the limiting holes 213, 222, 232, the coupling member 20 drives the pivoting members 40 to rotate, and front ends of the inner walls of the second notches 411 resist the resisting structures 51.

When the rotating member 30 continues to move counterclockwise, because the second limiting posts 113, 122, 132 can no longer move relative to the limiting holes 213, 222, 232, the first protrusion 311 drives the coupling member 20 to move, and the frame body 10 moves together with the coupling member 20. At the same time, the coupling member 20 drives the pivoting members 40 to rotate. Because the pivoting members 40 resist the resisting structures 51, both sides of the frame body 10 are more stable during movement of the frame body 10.

It can be understood that, in other embodiments, the rotation direction of the rotating member 30 can be adjusted to be clockwise, and the above-mentioned movement effect can also be achieved.

Figure 6:
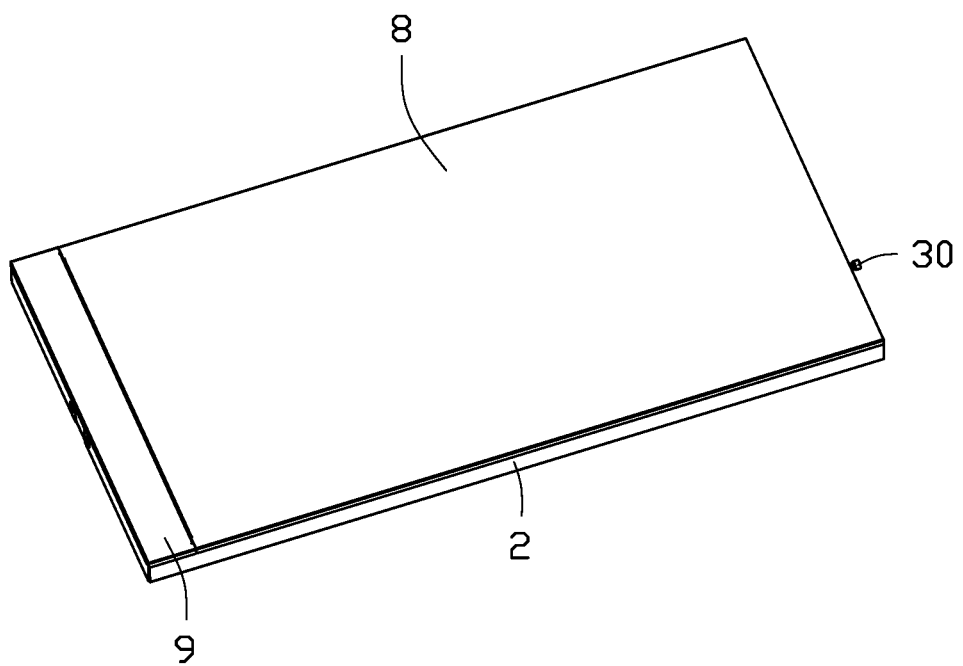
FIG. 6 is a schematic perspective view of a chassis according to an embodiment.
Figure 7:
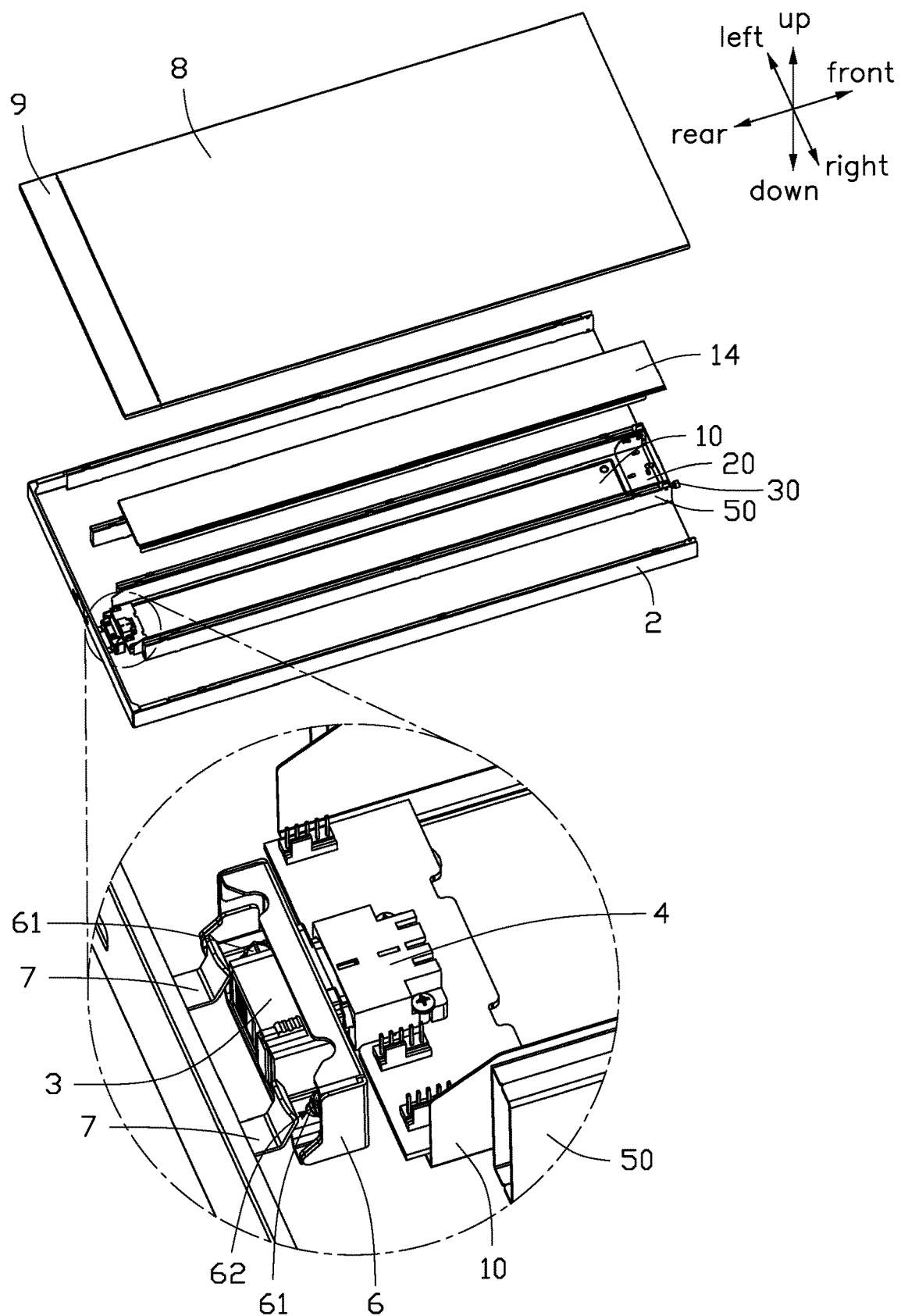
FIG. 7 is an exploded view of the chassis shown in FIG. 6.

Referring to FIGS. 6 and 7, in another embodiment, a chassis 100 is further provided. The chassis 100 includes a cabinet 2, a first connector 3, and a second connector 4. The chassis 100 includes any of the above implementations of the chassis mounting frame 1, and the chassis mounting frame 1 will not be described in detail further. The chassis mounting frame 1 is movably mounted in the cabinet 2, the first connector 3 is located in the cabinet 2, and the second connector 4 is located on the chassis mounting frame 1.

After the chassis mounting frame 1 moves another predetermined distance toward the first connector 3, the first connector 3 is connected to the second connector 4.

Referring to FIG. 7, the cabinet 2 is a hollow cuboid without a cover, the first connector 3 is provided at a rear end of the cabinet 2, and the second connector 4 is provided at a rear end of the chassis mounting frame 1.

In one embodiment, a plurality of the chassis mounting frames 1 can be accommodated in the cabinet 2. Correspondingly, a plurality of the first connectors 3 can be provided on the cabinet 2 a plurality of the second connectors 4 can be provided on the chassis mounting frames 1. The fixing plate 50 is fixed in the cabinet 2. Two adjacent chassis mounting frames 1 can share the same fixing plate 50, thereby saving costs.

The chassis further includes a fixing frame 6, a resilient member 7, a first upper cover 8, and a second upper cover 9. The fixing frame 6 is arranged in the cabinet 2, and the first connector 3 is arranged on the fixing frame 6. The resilient member 7 is disposed on a side of the fixing frame 6 facing away from the chassis mounting frame 1, and part of the fixing frame 6 is connected to the resilient member 7. The first upper cover 8 and the second upper cover 9 are detachably covered on the cabinet 2 so as to cover the cabinet 2. A size of the first upper cover 8 is larger than a size of the second upper cover 9, and the second upper cover 9 covers the first connector 3 and the second connector 4. If it is necessary to replace or repair the first connector 3 or the second connector 4, only the second upper cover 9 needs to be removed.

Referring to FIG. 7, the fixing frame 6 defines a fixing hole 62 and is fixed in the cabinet 2 through a fixing stud 61. The fixing stud 61 is provided at the position of the fixing hole 62. The length of the fixing hole 62 along a front-rear direction is larger than the diameter of the fixing stud 61, so that the fixing frame 6 has a certain buffer distance during a process of connecting the first connector 3 and the second connector 4. Further, there is a gap (not shown) between the fixing stud 61 and the fixing frame 6 in the up-down direction, which also acts as a buffer for the fixing frame 6.

The resilient member 7 is substantially L-shaped in cross-section. Part of the fixing frame 6 is connected to the resilient member 7, and the resilient member 7 provides a supporting force for the fixing frame 6 during the insertion of the second connector 4. In one embodiment, the resilient member 7 is an elastic sheet. It can be understood that, in other embodiments, the resilient member 7 may also be replaced with an elastic bracket or other structure having equivalent functions.

A process of disengaging and connecting the first connector 3 and the second connector 4 will be described below.

Figure 8:
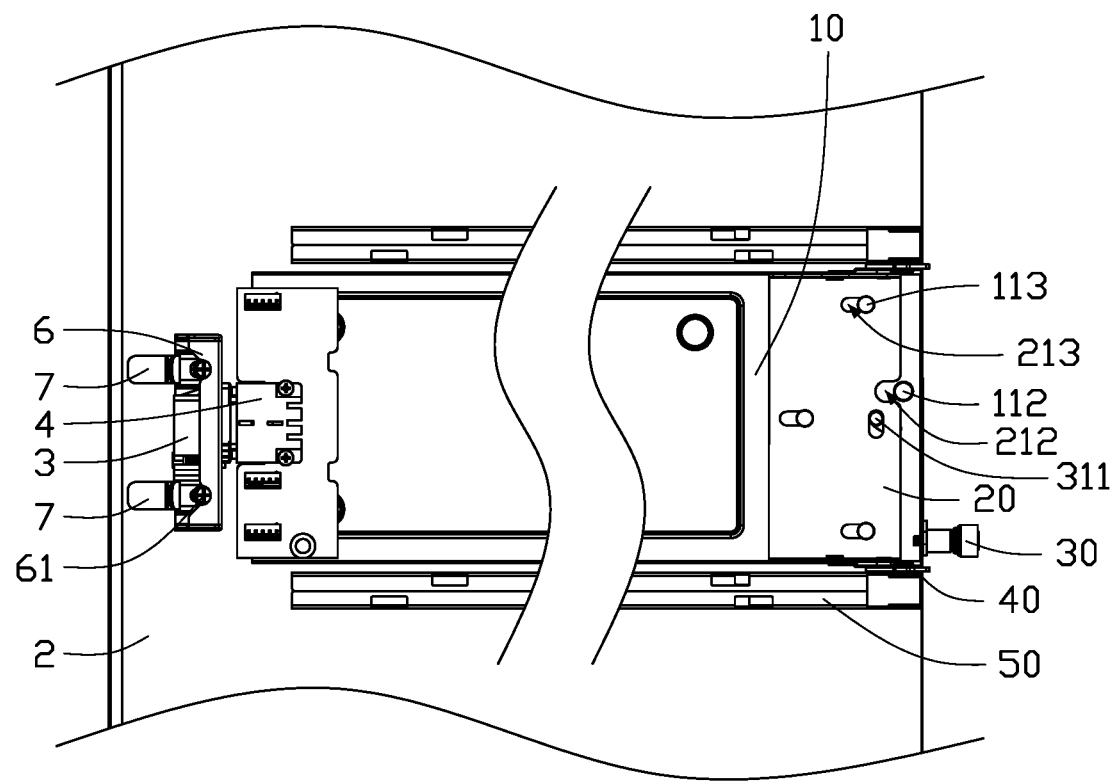
FIG. 8 is a schematic top view of the chassis mounting frame located inside the chassis.

Referring to FIG. 8, the chassis mounting frame 1 is located inside the cabinet 2, the first connector 3 and the second connector 4 are connected, and there is no gap between the first connector 3 and the second connector 4.

Figure 9:
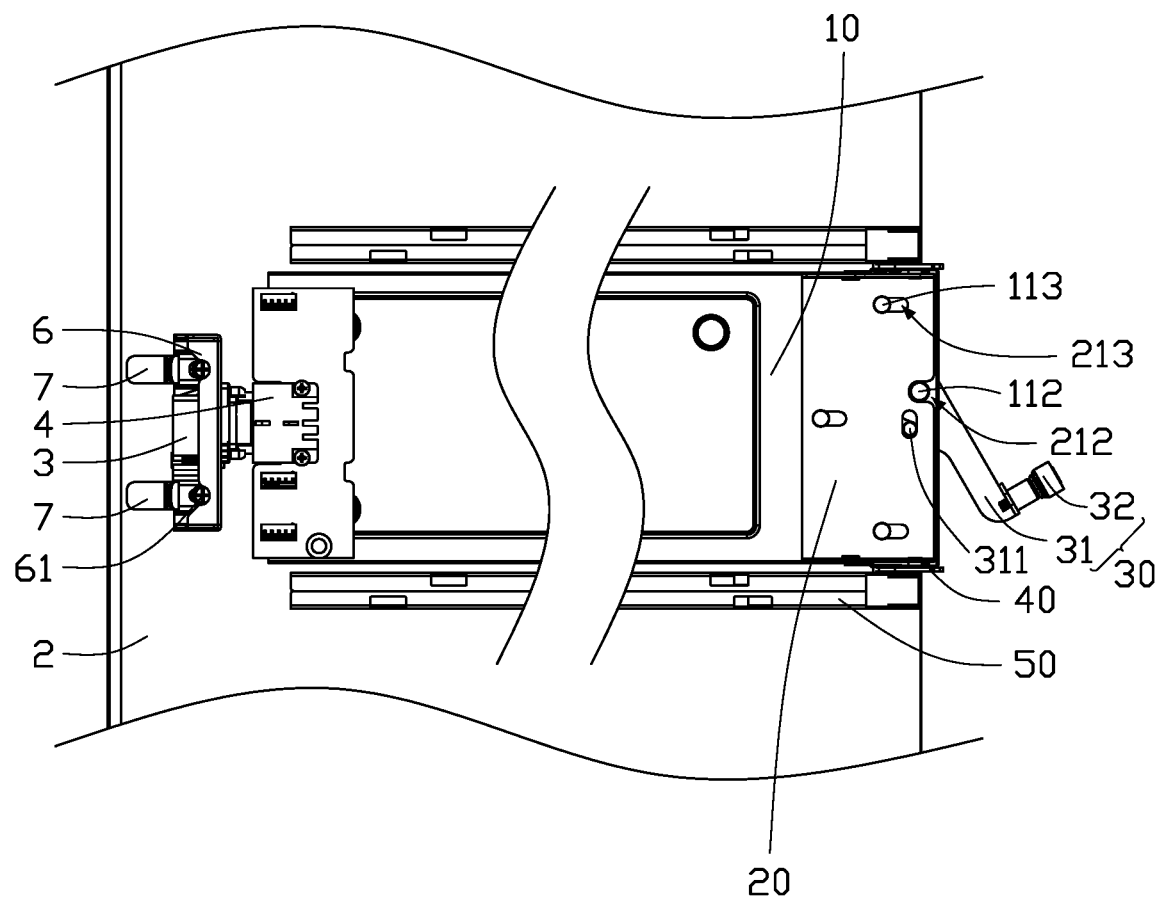
FIG. 9 is a schematic top view showing the chassis mounting frame partially removed out of the chassis based on FIG. 8.
Figure 10:
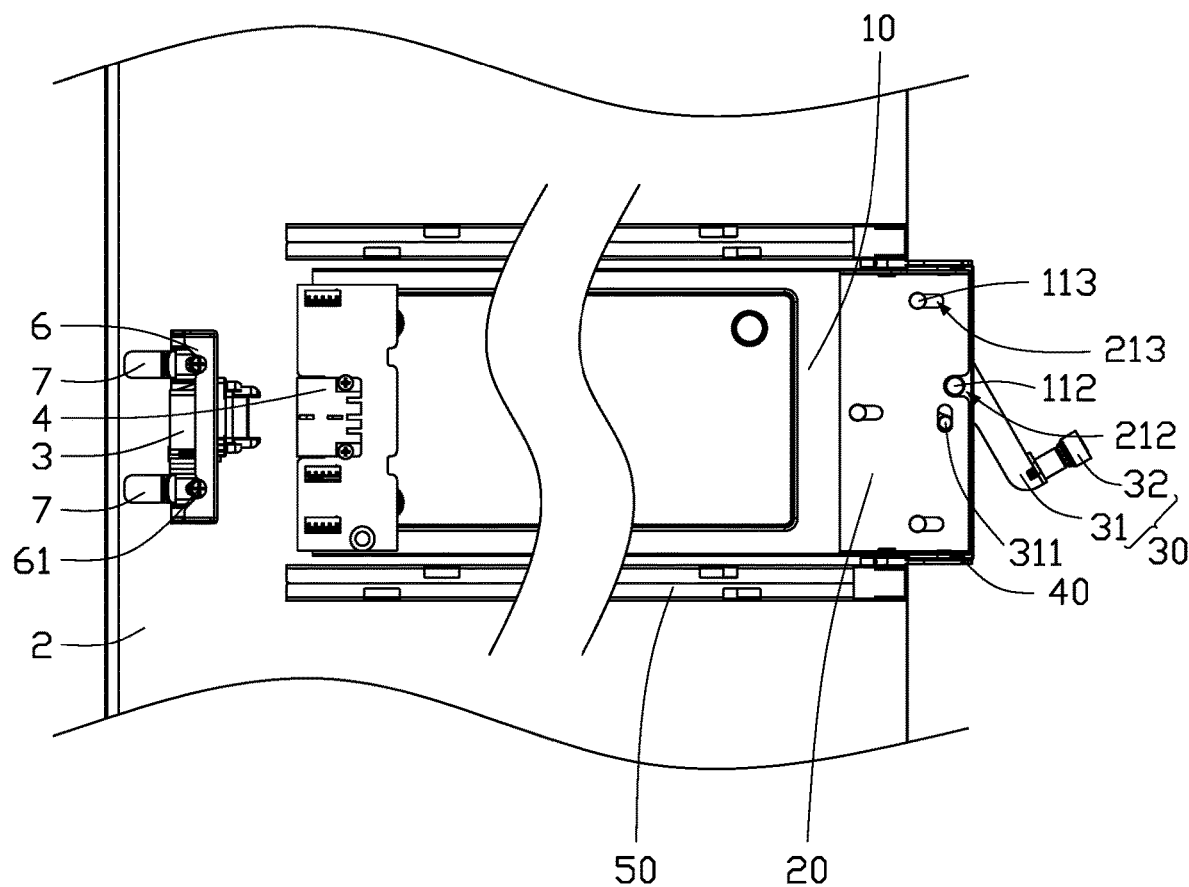
FIG. 10 is a schematic top view showing a first connector detached from a second connector based on FIG. 9.

Referring to FIG. 9 and FIG. 10, when the operating portion 32 is pulled, the rotating member 30 is rotated, and the rotating member 30 drives the coupling member 20 to move away from the first connector 3.

Then, when the rotating member 30 continues to rotate, the rotating member 30 drives the coupling member 20 and the chassis mounting frame 1 to move away from the first connector 3 at the same time. At this time, the second connector 4 partially disengages from the first connector 3.

When the frame body 10 continues to move away from the first connector 3, the resisting structures 51 no longer resist against the pivoting members 40, the frame body 10 drives the coupling member 20, the rotating member 30, the pivoting members 40, and the second connector 4 to move out of the cabinet 2.

Referring to FIGS. 8-10, to connect the first connector 3 and the second connector 4, the chassis mounting frame 1 is first pushed toward the first connector 3 until front sides of inner walls of the second notches 411 contact the resisting structures 51, and part of the second connector 4 abuts the first connector 3.

Then, the rotating member 30 is rotated clockwise, the first limiting post 112 is no longer locked in the first groove 212, the first protrusion 311 moves from the right end of the second through hole 211 to the left end, the second protrusions 42 move from the upper end to the lower end of the fourth through holes 221, 231, the second limiting posts 113, 122, 132 move from the rear end of the limiting holes 213, 222, 232 to the front end, the coupling member 20 drives the pivoting member 40 to rotate, and rear ends of the inner walls of the second notches 411 resist the resisting structures 51.

The rotating member 30 is continued to rotate clockwise. Because the second limiting posts 113, 122, 132 can no longer move relative to the limiting holes 213, 222, 232, during a process of the first protrusion 311 driving the coupling member 20 to move, the frame body 10 also moves with the coupling member 20. At the same time, the coupling member 20 drives the pivoting members 40 to rotate. Because the pivoting members 40 resist against the resisting structures 51, the resisting structures 51 provide a force evenly distributed on both sides of the frame body 10 while the frame body 10 moves, so that the frame body 10 moves smoothly. Then, the second connector 4 is stably inserted into the first connector 3.

In summary, the chassis mounting frame 1 and the chassis 2 provided by the present application use the rotating member 30 to drive the coupling member 20 and the frame body 10 to move, so that an external force for moving the frame body 10 is evenly distributed on both sides of the frame body 10. Furthermore, when the chassis mounting frame 1 is used in the chassis 2, the force and direction of the second connector 4 are relatively stable while the frame body 10 drives the second connector 4 to move, so that there is no gap between the first connector 3 and the second connector 4 when the second connector 4 connects with the first connector 3. The chassis mounting frame 1 has a simple structure and is convenient to use, which can effectively avoid the deviation of the first connector 3 and the second connector 4 during the connection process. It can be understood that, in other embodiments, such as when docking an expansion card and a connector, the chassis mounting frame 1 provided by the present application may also be used.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A chassis mounting frame comprising:
a frame body;
at least one fixing plate mounted on a side of the frame body, the at least one fixing plate comprising a resisting structure;
a coupling member;
a rotating member provided on the frame body and coupled to the coupling member and configured to drive the coupling member to move inside the frame body and drive the coupling member and the frame body to move together; and
at least one pivoting member provided on a side of the frame body and coupled to the coupling member, the coupling member configured to drive the at least one pivoting member to rotate to resist against the resisting structure
wherein the rotating member comprises a first protrusion, the pivoting member comprises a second protrusion, the frame body defines a first through hole and a third through hole, the coupling member defines a second through hole and a fourth through hole, a predetermined angle is defined between the first through hole and the second through hole, the first protrusion is received in the first through hole and the second through hole, a predetermined angle is defined between the third through hole and the fourth through hole, the second protrusion is received in the third through hole and the fourth through hole;
when the rotating member is rotated, the first protrusion simultaneously moves in the first through hole and the second through hole to drive the coupling member to move;
when the rotating member drives the coupling member to move, the second protrusion simultaneously moves in the third through hole and the fourth through hole to drive the pivoting member to rotate.

2. The chassis mounting frame of claim 1, wherein:
the frame body comprises a first limiting post;
the coupling member defines a first notch corresponding in position to the first limiting post; and
when the coupling member moves toward the first limiting post a predetermined distance, the first limiting post is fixed in the first notch.

3. The chassis mounting frame of claim 2, wherein:
one of the frame body and the coupling member comprises at least one second limiting post, and the other one of the frame body and the coupling member defines at least one limiting hole; and
the at least one second limiting post is received in the at least one limiting hole.

4. The chassis mounting frame of claim 1, wherein:
the rotating member comprises a rotating portion and an operating portion coupled to the rotating portion;
the rotating portion is mounted on the frame body; and
the operating portion is configured to drive the rotating portion to rotate.

5. The chassis mounting frame of claim 1, wherein:
a number of the pivoting members is two, the two pivoting members are respectively provided on two outer sides of the frame body;
a number of the fixing plates is two, each of the two fixing plates comprising the resisting structure; and
each of the two pivoting members engages with one of the two resisting structures.

6. The chassis mounting frame of claim 5, wherein:
each of the two pivoting members defines a notch in a position corresponding to the resisting structure; and
the resisting structure is configured to resist against an inner wall of the notch.

7. A chassis comprising:
a first connector provided in the chassis;
a second connector; and
a chassis mounting frame movably provided in the chassis, the second connector provided on the chassis mounting frame; wherein:

when the chassis mounting frame is moved toward the first connector a predetermined distance, the first connector is coupled to the second connector;
the chassis mounting frame comprises a frame body, at least one fixing plate, a coupling member, a rotating member, and at least one pivoting member; wherein:
the at least one fixing plate is mounted on a side of the frame body, the at least one fixing plate comprising a resisting structure;
the rotating member is provided on the frame body and coupled to the coupling member and configured to drive the coupling member to move inside the frame body and drive the coupling member and the frame body to move together; and
the at least one pivoting member is provided on a side of the frame body and coupled to the coupling member, the coupling member is configured to drive the at least one pivoting member to rotate to resist against the resisting structure;
the rotating member comprises a first protrusion, the pivoting member comprises a second protrusion, the frame body defines a first through hole and a third through hole, the coupling member defines a second through hole and a fourth through hole, a predetermined angle is defined between the first through hole and the second through hole, the first protrusion is received in the first through hole and the second through hole, a predetermined angle is defined between the third through hole and the fourth through hole, the second protrusion is received in the third through hole and the fourth through hole;
when the rotating member drives the coupling member to move, the second protrusion simultaneously moves in the third through hole and the fourth through hole to drive the pivoting member to rotate.

8. The chassis of claim 7, wherein:
the frame body comprises a first limiting post;
the coupling member defines a first notch corresponding in position to the first limiting post; and
when the coupling member moves toward the first limiting post a predetermined distance, the first limiting post is fixed in the first notch.

9. The chassis of claim 8, wherein:
one of the frame body and the coupling member comprises at least one second limiting post, and the other one of the frame body and the coupling member defines at least one limiting hole; and
the at least one second limiting post is received in the at least one limiting hole.

10. The chassis of claim 9, wherein:
the rotating member comprises a rotating portion and an operating portion coupled to the rotating portion;
the rotating portion is mounted on the frame body; and
the operating portion is configured to drive the rotating portion to rotate.

11. The chassis of claim 10, wherein:
a number of the pivoting members is two, the two pivoting members are respectively provided on two outer sides of the frame body;
a number of the fixing plates is two, each of the two fixing plates comprising the resisting structure; and
each of the two pivoting members engages with one of the two resisting structures.

12. The chassis of claim 11, wherein:
each of the two pivoting members defines a second notch in a position corresponding to the resisting structure; and
the resisting structure is configured to resist against an inner wall of the second notch.

* * * * *